United States Patent
Inaba et al.

(10) Patent No.: US 9,426,922 B2
(45) Date of Patent: Aug. 23, 2016

(54) IN-VEHICLE ELECTRONIC CONTROL UNIT

(71) Applicant: DENSO CORPORATION, Kariya, Aichi-pref. (JP)

(72) Inventors: Masashi Inaba, Toyota (JP); Naoki Tanimoto, Kariya (JP); Kiyokazu Kamei, Aichi-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/865,473

(22) Filed: Sep. 25, 2015

(65) Prior Publication Data
US 2016/0174407 A1 Jun. 16, 2016

(30) Foreign Application Priority Data
Dec. 10, 2014 (JP) .................. 2014-250184

(51) Int. Cl.
H05K 5/00 (2006.01)
H05K 7/14 (2006.01)
H05K 5/02 (2006.01)
H05K 9/00 (2006.01)
H01F 5/00 (2006.01)

(52) U.S. Cl.
CPC ............. *H05K 7/1427* (2013.01); *H01F 5/00* (2013.01); *H05K 5/0204* (2013.01); *H05K 9/0049* (2013.01)

(58) Field of Classification Search
USPC .......................... 361/752, 748, 736
See application file for complete search history.

(56) References Cited

U.S. PATENT DOCUMENTS 7,667,971 B2 * 2/2010 Tominaga ............ B62D 5/0406
361/706
8,605,450 B2 * 12/2013 Kaneshige .......... H01M 2/1072
361/730
2001/0053070 A1 12/2001 Kitamura et al.

FOREIGN PATENT DOCUMENTS

JP 2004-193163 A 7/2004
JP 2008-279847 A 11/2008
JP 2013-149943 A 8/2013

* cited by examiner

*Primary Examiner* — Andargie M Aychillhum

(57) ABSTRACT

An in-vehicle electronic control unit includes a circuit board equipped with a coil and a power supply circuit, a resin member covering the circuit board, and a metal bracket fixed to the resin member for attaching the circuit board to a vehicle. The metal bracket includes a first shield portion and a second shield portion. The first shield portion is arranged to only a part of an upper surface of the resin member so that when projected in a winding axis direction of the coil, the first shield portion overlaps at least a part of the coil. The second shield portion extends from the first shield portion in the winding axis direction of the coil and is arranged to only a part of a side surface of the resin member.

6 Claims, 5 Drawing Sheets

IN-VEHICLE ELECTRONIC CONTROL UNIT

CROSS REFERENCE TO RELATED APPLICATION

The present application is based on Japanese Patent Application No. 2014-250184 filed on Dec. 10, 2014, disclosure of which is incorporated herein by reference.

TECHNICAL FIELD

The present disclosure relates to an in-vehicle electronic control unit including a circuit board and a resin member. The circuit board is equipped with a power supply circuit for performing voltage conversion and mounted with a coil constituting the power supply circuit. The resin member covers the circuit board to protect the circuit board.

BACKGROUND

There is known an in-vehicle electronic control unit including a circuit board and a resin member. The circuit board is equipped with a power supply circuit for performing voltage conversion and mounted with a coil constituting the power supply circuit. The resin member covers the circuit board to protect the circuit board. The resin member is a case which is pre-formed or a molded resin body which is formed to seal the circuit board. Via a bracket fixed to the resin member, the in-vehicle electronic control unit of this kind is attached to a vehicle.

In this in-vehicle electronic control unit, because the circuit board is covered with the resin member, AM band radiation noise generated by the coil is radiated to an outside of the in-vehicle electronic control unit and may be superimposed on an AM radio signal. That is, the radiation noise is superimposed on a radio of the vehicle.

JP2002-9478A corresponding to US2001/0053070A discloses a structure in which electronic parts mounted on a circuit board are covered with an electromagnetic wave shield plate made of metal. When this structure is employed, the level of radiation noise radiated to the outside can be reduced while the circuit board is covered with a resin member.

However, when the structure described in JP2002-9478A corresponding to US2001/0053070A is employed, the number of parts of the in-vehicle electronic control unit increases.

Incidentally, it is conceivable to reduce the level of radiation noise radiated to the outside by employing a metal case in place of the resin member. However, this increases the weight of the in-vehicle electronic control unit and increases the cost.

SUMMARY

It is an object of the present disclosure to provide an in-vehicle electronic control unit that can reduce the number of parts and radiation noise and can suppress a weight increase.

In an aspect of the present disclosure, an in-vehicle electronic control unit comprises a circuit board, a resin member and a metal bracket. The circuit board has a front surface and a rear surface opposite to the front surface. The circuit board is equipped with a power supply circuit that performs voltage conversion. A coil constituting the power supply circuit is mounted on the front surface of the circuit board. The resin member covers the circuit board to protect the circuit board. An outer surface of the resin member has an upper surface and a lower surface opposite to the upper surface. The upper surface of the resin member is located on a front surface side of the circuit board and the lower surface of the resin member is located on a rear surface side of the circuit board. The resin member further has a side surface that connects the upper surface and the lower surface. The metal bracket is provided for attaching the circuit board to a vehicle and is fixed to the resin member. The metal bracket includes a first shield portion and a second shield portion. The first shield portion is arranged to only a part of the upper surface of the resin member so that when projected in a winding axis direction of the coil, the first shield portion overlaps at least a part of the coil. The second shield portion extends from the first shield portion in the winding axis direction of the coil and is arranged to only a part of the side surface of the resin member. The metal bracket is to be electrically connected to a body of the vehicle.

According to the above in-vehicle electronic control unit, the metal bracket can function as an electromagnetic shield. Specifically, mainly by reflection loss resulting from mismatching of intrinsic impedances and attenuation loss resulting from skin effects, spacial conduction of radiation noise can be cut off. Because not only the first shield portion is arranged in the winding axis direction, i.e., arranged to the upper surface of the resin member but also the second shield portion is arranged to the side surface of the resin member, the radiation nose can be efficiently reduced. This is revealed by the inventors of the present application.

Moreover, because the metal bracket is to be connected to the body of the vehicle, i.e., connected to ground which is stable, the metal bracket can function as an antenna and radiation of noise from the metal bracket can be reduced. This also can reduce the radiation noise.

Moreover, the above technical effects can be achieved by arranging the first shield portion to only a part of the upper surface of the resin member and arranging the second shield portion to only a part of the side surface of the resin member. Therefore, in addition to reducing the radiation noise, it is possible to reduce the weight as compared with a structure in which a metal case is employed in place of the resin member.

Moreover, because the metal bracket for fixing the in-vehicle electronic control unit to the vehicle is used as an electromagnetic shield, it is possible to reduce the number of parts of the in-vehicle electronic control unit in addition to reducing the radiation noise.

BRIEF DESCRIPTION OF THE DRAWINGS

The above and other objects, features and advantages of the present disclosure will become more apparent from the below-described detailed description made with reference to the accompanying drawings, in which.

DETAILED DESCRIPTION

Embodiments will be described with reference to drawings. In the below description, like references are used to refer to like parts. A z-direction is a winding axis direction of a coil, where the coil constitutes a power supply circuit in a circuit board. A y-direction is a direction perpendicular to the z-direction. An x-direction is a direction perpendicular to both the z-direction and the y-direction. A planer shape is a shape in an x-y plane, unless otherwise specified.

First Embodiment

A structure of an electronic control unit of the present embodiment will be described based on FIGS. 1 to 4.

Figure 1:
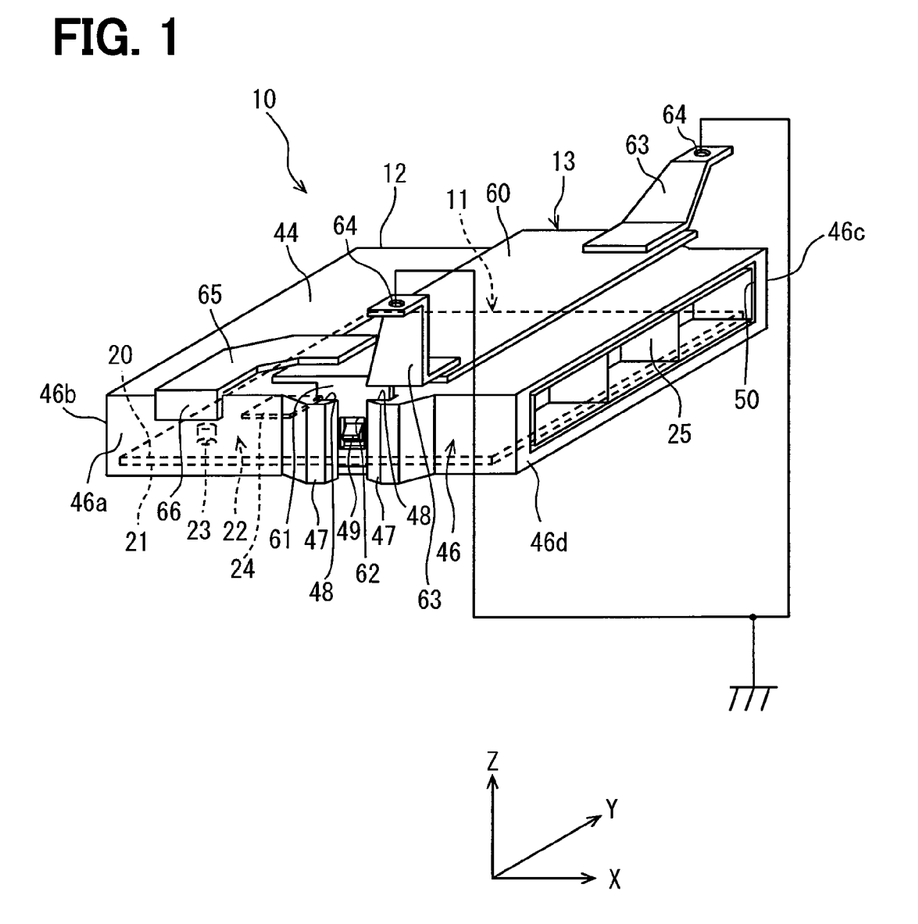
FIG. 1 is a schematic perspective view illustrating a structure of an electronic control unit of a first embodiment.

An electronic control unit 10 illustrated in FIG. 1 is mounted to a vehicle and corresponds to an in-vehicle electronic control unit. In the present embodiment, the electronic control unit 10 is configured as an engine ECU (electronic control unit).

As shown in FIGS. 1 to 4, the electronic control unit 10 includes a circuit board 11, a case 12, and a metal bracket 13. Among these, the case 12 corresponds to a resin member.

In the circuit board 11, electronic parts are mounted to so called a printed circuit board and a circuit is formed. In the printed circuit board, an electrically insulating substrate such as a resin substrate, a ceramic substrate or the like has wirings. The circuit board 11 has a front surface 20 (also called one surface) and a rear surface 21 opposite to the front surface 20 in the z-direction.

Figure 4:
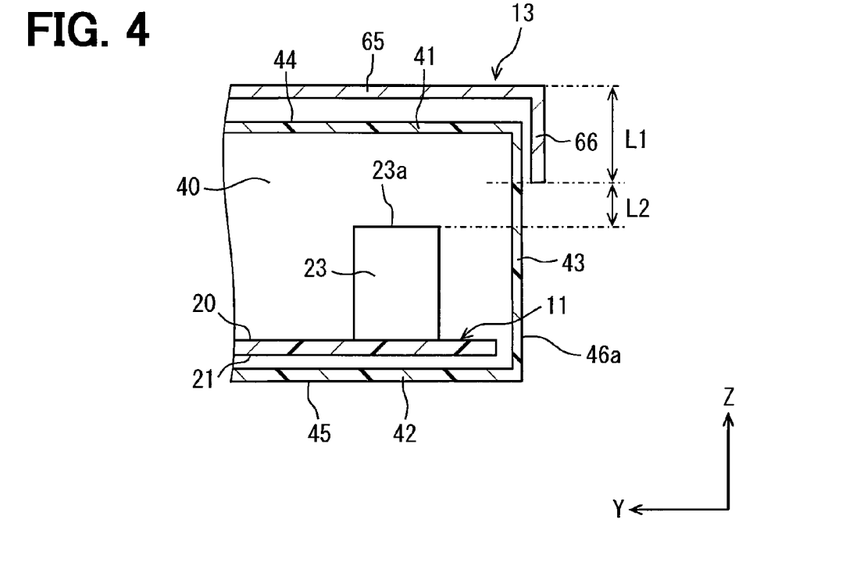
FIG. 4 is a sectional view taken along line IV-IV in FIG. 2.

The circuit of the circuit board 11 includes a power supply circuit 22, as shown in FIG. 1. This power supply circuit 22 acts as a switching power supply, which performs voltage conversion by at least one of step-up or step-down. As shown in FIG. 4, a coil 23 and an IC chip 24 are mounted on the front surface 20 of the circuit board 11. The coil 23 constitutes the power supply circuit 22. Specifically, the coil 23 constitutes a smoothing circuit of the switching power supply. The winding axis of the coil 23 and the z-direction match with each other. The IC chip 24 includes a switch, a control circuit for controlling the switch, and the like.

A connector 25 is mounted to the circuit board 11. A part of the connector 25 is exposed from the case 12 to an outside, as shown in FIG. 1. Accordingly, via the connector 25, the circuit formed in the circuit board 11 is electrically connectable to other electrical equipment than the electronic control unit 10.

The case 12 is made of a resin material. The case 12 covers the circuit board 11 in order to protect the circuit board 11. Before this case 12 covers the circuit board 11, the case 12 is formed to have an interior space 40. The circuit board 11 is accommodated in this interior space 40. Specifically, as shown in FIG. 4, the case 12 includes a upper wall portion 41 located on a front surface 20 side of the circuit board 11 (i.e., located on an opposite side of the circuit board 11 from the rear surface 21), a bottom wall portion 42 located on a rear surface side of the circuit board 11 (i.e., located on an opposite side of the circuit board 11 from the front surface 20), and a side wall portion 43 connecting the upper wall portion 41 and the bottom wall portion 42. These upper wall portion 41, bottom wall portion 42 and side wall portion 43 define the interior space 40.

The case 12 may have what is called an upper-lower-separable structure, in which a part including the upper wall portion 41 and a part including the bottom wall portion 42 are separable. Alternatively, the case 12 may have what is called a bag structure, in which one of the side wall portions 43 is attachable to and detachable from the other portions of the case 12. In the present embodiment, an upper end surface 23a of the coil 23 is not in contact with an inner surface of the upper wall portion 41, so that the upper end surface 23a and the upper wall portion 41 have a space therebetween. In the above, the upper end surface 23a of the coil 23 is on an opposite side of the coil 23 from the front surface 20 of the circuit board 11. The inner surface is a surface exposed to the interior space 40.

The upper wall portion 41 has an upper surface 44, which is opposite to the inner surface. The upper surface 44 is a part of an outer surface of the case 12. The bottom wall portion 42 has a lower surface 45, which is opposite to an inner surface of the bottom wall portion 42. The side wall portion 43 has a side surface 46, which is opposite to an inner surface of the side wall portion 43.

In the present embodiment, the case 12 has substantially a rectangular shape as its planer shape. Specifically, the case 12 has a rectangular parallelopiped shape. Thus, the case 12 has four side surfaces 46. Among the four side surfaces 46, a first side surface 46a and a third side surface 46c are opposite to each other, and a second side surface 46b and a fourth side surface 46d are opposite to each other. The first side surface 46a and the third side surface 46c are substantially parallel to a z-x plane. The second side surface 46b and the fourth side surface 46d are substantially parallel to a y-z plane. Among the four side surfaces 46, the first side surface 46a is closest to the coil 23.

The first side surface 46a has two protrusions 47 near the center of the first side surface 46a in the x-direction. The two protrusions 47 are spaced apart by a predetermined interval in the x-direction. In the z-direction, each protrusion 47 extends from one end to the other end of the first side surface 46a. Each protrusion 47 is provided with a groove 48. The grooves 48, respectively, are formed in facing surfaces of base portions of the two protrusions 47. The facing surfaces of the two protrusions 47 are surfaces that face each other. The grooves 48 is formed along the z-direction. In the z-direction, the groove 48 opens at least toward the upper surface 44 from the protrusion 47. One protrusion 47 is symmetric (mirror symmetric) to the other protrusion 47 with respect to the y-z plane. One groove 48 is symmetric (mirror symmetric) to the other groove 48 with respect to the y-z plane. Specifically, the pair of the one protrusion 47 and the one groove 48 is symmetric (mirror symmetric) to the pair of the other protrusion 47 and the other groove 48 with respect to the y-z plane. To the groove 48, the below-described press-fitting fixation portion 61 is press-fitted.

The first side surface 46a has an engagement protrusion 49 between the two protrusions 47. The engagement protrusion 49 is at around a z-direction center of the first side surface 46a. The third side surface 46c has protrusions 47, grooves 48 and an engagement protrusion 49 as is the case in the first side surface 46a.

The side wall portion 43 defining the fourth side surface 46d has an opening 50 for exposing the connector 25.

Because of this, one end of a terminal (not shown) of the connector 25 is exposed to an outside.

The metal bracket 13 is a metal member for attaching the circuit board 11 accommodated in the case 12 to the vehicle (not shown). The metal bracket 13 is fixed to the case 12. A manner for fixing to the case 12 is not specifically limited. For example, in the present embodiment, the metal bracket 13 is fixed to the case 12 by press-fitting.

The metal bracket 13 includes a base 60. The base 60 is arranged to the upper surface 44. The base 60 is a flat plate and has a rectangular shape as its planer shape. The base 60 faces only a part of the upper surface 44. The base 60 is supported in a floating state relative to the upper surface 44. In other words, the base 60 is arranged above the upper surface 44 so that the base 60 is not in contact with the upper surface 44.

The base 60 is arranged over a region from one end of the upper surface 44 to the other end of the upper surface 44 in the y-direction. The one and other ends of the base 60 are connected to the press-fitting fixation portions 61, respectively. The press-fitting fixation portions 61 are integrated with the base 60. In other words, the press-fitting fixation portions 61 and the base 60 constitute a single body. The press-fitting fixation portion 61 is bent with respect to the base 60 and extends in the z-direction. The press-fitting fixation portion 61 is press-fitted to the groove 48 of the case 12. The press-fitting fixation portion 61 has a through-hole 62 for engaging with an engagement protrusion 49. Among the metal bracket 13, only the press-fitting fixation portion 61 is in contact with the case 12. This prevents the following; portions of the metal bracket 13 other than the press-fitting fixation portion 61 contacts with the case 12 due to, for example, vehicle vibrations and unusual sounds or the like are generated.

The base 60 is further connected to an arm portion 63. In the present embodiment, the arm portion 63 is connected to a specific surface of the base 60 by, for example, welding. The specific surface is opposite to a facing surface of the base 60 which faces the upper surface 44. Two arm portions 63, respectively, are connected to opposite ends of the base 60. Each arm portion 63 has substantially a crank shape that extends away from the upper surface 44 in the z-direction and extends to an outside of the case 12 in the y-direction. Around a tip of the arm portion 63, the arm portion 63 has a screw hole 64 for attachment to the vehicle. In the present embodiment, the metal bracket 13 is fixed to a body of the vehicle by screwing with the screw hole 64. This electrically connects the metal bracket 13 to the body of the vehicle.

The base 60 is further connected to a first shield portion 65. The first shield portion 65 is connected to the base 60 by, for example, welding. The first shield portion 65 is arranged to the upper surface 44 of the case 12 as is the case in the base 60. The first shield portion 65 is a flat plate having substantially an L-shape. The first shield portion 65 faces only a part of the upper surface 44. A portion being a combination of the first shield portion 65 and the base 60 faces a part of the upper surface 44. The first shield portion 65 is supported in a floating state relative to the upper surface 44.

Figure 2:
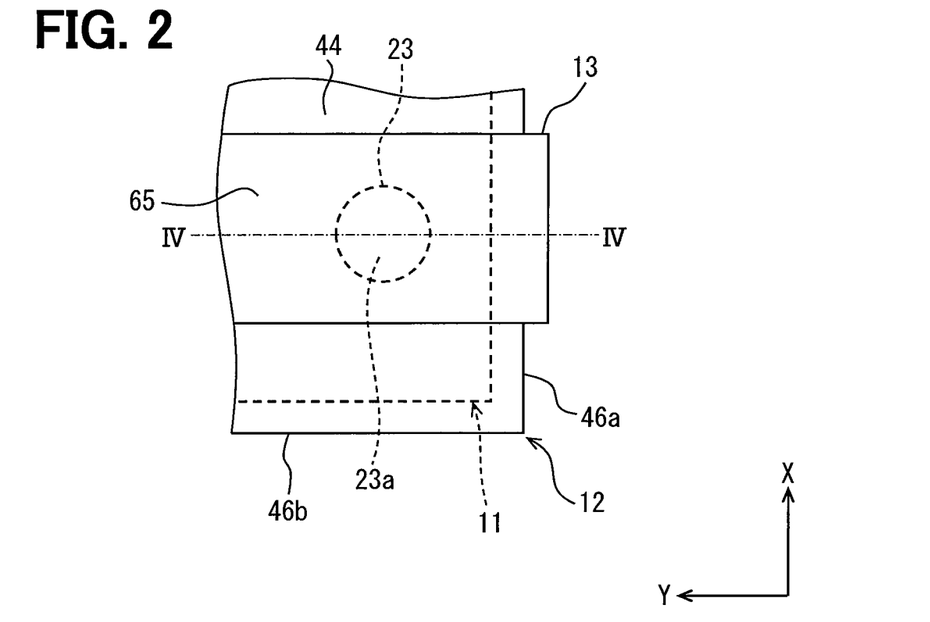
FIG. 2 is a top view illustrating a structure around a first shield portion of the electronic control unit of the first embodiment.

The first shield portion 65 is arranged so that when projected in the z-direction, the first shield portion 65 overlaps at least a part of the coil 23. As shown in FIG. 2, in the present embodiment, a width of the first shield portion 65 (length in the x-direction) is larger than a diameter of an outer boundary of the coil 23. The first shield portion 65 is arranged so as to overlap the whole of the coil 23 when projected in the z-direction.

Figure 3:
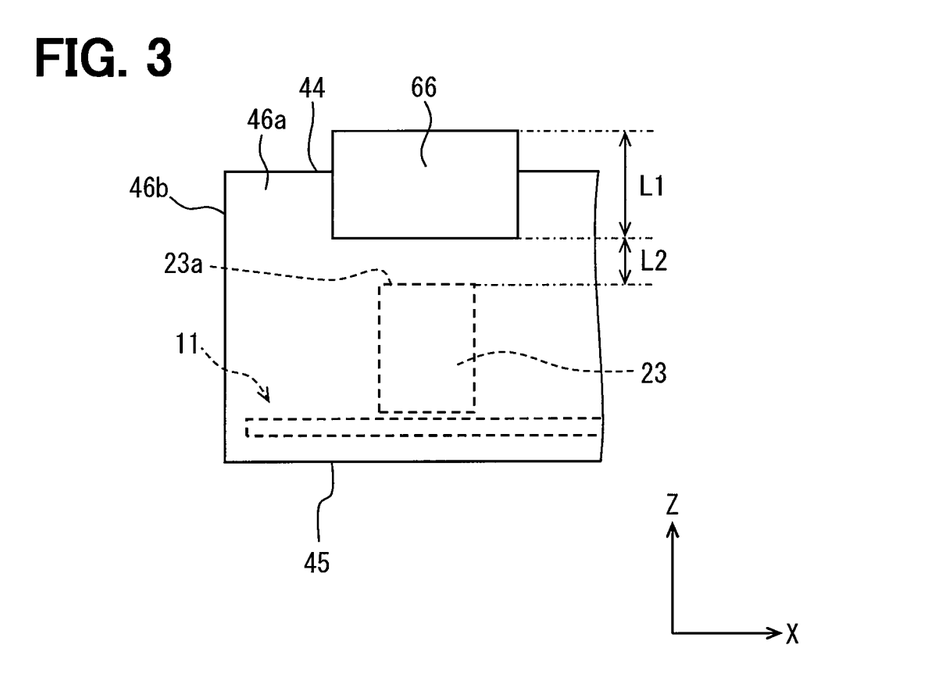
FIG. 3 is a side view illustrating a structure around a second shield portion of the electronic control unit of the first embodiment.

A second shield portion 66 is connected to an end of the first shield portion 65. The second shield portion 66 and the base 60, respectively, are connected to opposite ends of the base 60. The second shield portion 66 is integrated with the first shield portion 65. In other words, the he second shield portion 66 and the first shield portion 65 constitute a single body. The second shield portion 66 is bent with respect to the first shield portion 65 and extends in the z-direction. As shown in FIG. 3, the second shield portion 66 faces only a part of the side surface 46. The second shield portion 66 is supported in a floating state relative to the side surface 46.

In the present embodiment, the second shield portion 66 is arranged to only the first side surface 46a among the multiple side surfaces 46. It is noted that the first side surface 46a is closest to the coil 23 among the multiple side surfaces 46. The second shield portion 66 faces only a part of the first side surface 46a. In the embodiments, a distance between each side surface 46 and the coil 23 is defined as a distance from the side surface 46 to the winding axis of the coil 23 in a direction perpendicular to the side surface 46.

When projected in the y-direction perpendicular to the first side surface 46a, the second shield portion 66 extends in the z-direction so that that the second shield portion 66 and the upper end surface 23a of the coil 23 have a gap therebetween. Specifically, as shown in FIGS. 3 and 4, a length L2 of the gap is substantially equal to or less than a length L1 of the second shield portion 66, where the length L1 is a length of the second shield portion 66 in the z-direction. For example, the length L1 of the second shield portion 66 may be 10 mm and the length L2 of the gap may be in a range between 5 mm and 10 mm.

The second shield portion 66 is arranged so that in a direction parallel to the first side surface 46a (for which the second shield portion 66 is arranged) and perpendicular to the z-direction, i.e., in the x-direction, the position of the second shield portion 66 at least in part matches with the position of the coil 23. In the present embodiment, a width of the second shield portion 66 (length in the x-direction) is longer than the diameter of the outer boundary of the coil 23. As shown in FIG. 3, the second shield portion 66 is arranged so that in the x-direction, coordinate points occupied by the second shield portion 66 contain coordinate points occupied by the coil 23.

Technical effects of the above electronic control unit 10 will be described.

In the present embodiment, the metal bracket 13 includes the first shield portion 65 for reducing AM band radiation noise emitted by the coil 23. The first shield portion 65 is arranged to only a part of the upper surface 44 so that when projected in the x-direction which matchers with the winding axis direction of the coil 23, the first shield portion 65 overlaps at least a part of the coil 23. Additionally, in the present embodiment, the metal bracket 13 further includes the second shield portion 66 for reducing the radiation noise. The second shield portion 66 is arranged to only a part of the side surface 46.

In this structure, each shield portion 65, 66 of the metal bracket 13 functions as an electromagnetic shield. Specifically, spacial conduction of the radiation noise can be cut off mainly by reflection loss resulting from mismatching of intrinsic impedance of space with intrinsic impedance of each shield portion 65, 66 and attenuation loss resulting from skin effect. Accordingly, the radiation nose can be reduced. In particular, because of the presence of the second shield portion 66 in addition to the first shield portion 65, the radiation noise can be efficiently reduced as compared with a structure in which only the first shield portion 65 is present.

Moreover, because the metal bracket 13 is connected to the body of the vehicle, i.e., connected to ground which is stable, the metal bracket 13 functions as an antenna and radiation of noise from the metal bracket 13 can be reduced. This also can reduce the radiation noise.

Figure 5:
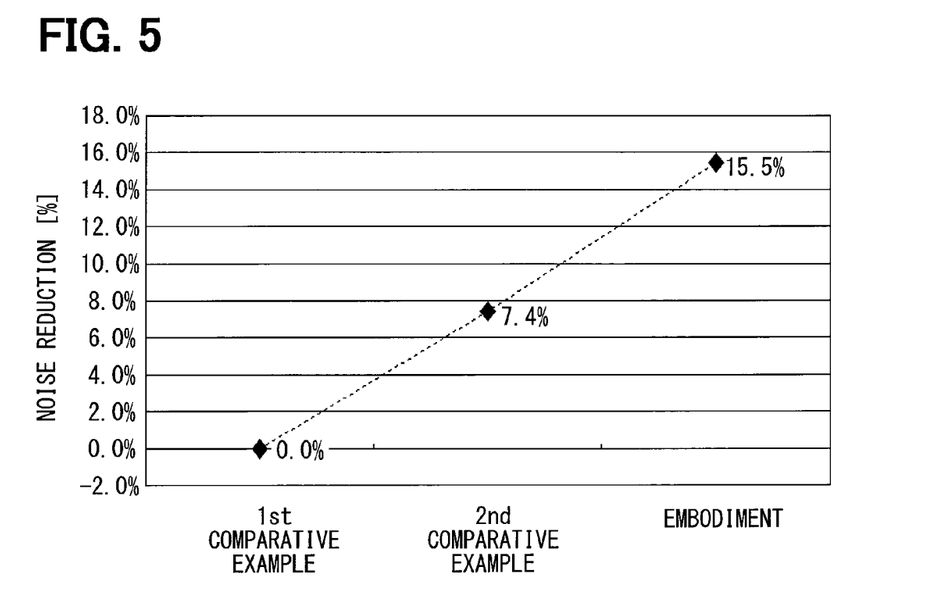
FIG. 5 is a graph illustrating noise reduction effects.

FIG. 5 shows results of actual measurements conducted by the inventors of the present application. The inventors of the present application used a step-down power supply circuit driven at 400 kHz and measured the strength of AM band radiation noise with an electric field antenna. During the measurement, the metal bracket 13 was electrically connected to the body of the vehicle. In FIG. 5, embodiment refers to a result of the measurement with the structure described in the present embodiment. The measurements were conducted with a structure not having the first and second shield portions and with a structure having only the first shield portion. In FIG. 5, first comparative example refers to a result of the measurement with the structure not having the first and second shield portions. Second comparative example refers to a result of the measurement with the structure having only the first shield portion. The results of the measurements in the second comparative example and the embodiment relative to the result of the measurement in the first comparative example are shown for the noise reduction effect (%).

FIG. 5 clearly shows that the structure of the present embodiment can efficiently reduce the radiation noise as compared with the first comparative example which does not have the first and second shield portions. It is also clear that the structure of the present embodiment can efficiently reduce the radiation noise as compared with the second comparative example which has only the first shield portion. Specifically, the structure of the present embodiment can reduce the radiation noise by about ten dB to several ten dB, as compared with the first comparative example.

As described above, in the present embodiment, though the first shield portion 65 is arranged to only a part of the upper surface 44 of the case and the second shield portion 66 is arranged to only a part of the side surface 46 of the case 12, the radiation noise can be efficiently reduced. Therefore, in addition to reducing the radiation noise, it is possible to reduce the weight as compared with a structure in which a metal case is employed in place of the resin case 12. Additionally, as compared with the metal case, it is possible reduce the cost.

Moreover, because the metal bracket 13 for fixing the electronic control unit 10 to the vehicle is used as an electromagnetic shield, it is possible to reduce the number of parts of the electronic control unit 10 in addition to reducing the radiation noise.

In the present embodiment, the second shield portion 66 is arranged to extend in the z-direction so that when projected in the y-direction perpendicular to the first side surface 46a, the second shield portion 66 and the upper end surface 23a of the coil 23 have a gap therebetween. Even when the extension length of the second shield portion 66 is arranged to be short in this way, the radiation noise can be efficiently reduced. This can further reduce the weight while efficiently reducing the radiation noise. It is noted that embodiment in FIG. 5 refers to the result of the measurement with the structure, in which the length of the second shield portion 66 is arranged to be short to produce the gap between the second shield portion 66 and the upper end surface 23a of the coil 23. That is, the technical effect of the short second shield portion 66 was also confirmed in the actual measurement.

Moreover, in the present embodiment, the second shield portion 66 is arranged so that in the x-direction, the position of the second shield portion 66 and the position of the coil 23 match with each other at least in part. Specifically, the second shield portion 66 is positioned at a specific portion of the side surface 46 (first side surface 46a) to which the second shield portion 66 is arranged, where the specific portion is a portion close to the coil 23 among the side surface 46 (first side surface 46a). When the second shield portion 66 is close to the coil 23 in this way, the reduction of the radiation noise can be enhanced.

Moreover, the second shield portion 66 is arranged to the first side surface 46a which is closest to the coil 23 among the multiple side surfaces 46. When the second shield portion 66 is close to the coil 23 in this way, the second shield portion 66 can enhance the reduction of the radiation noise. It is noted that embodiment in FIG. 5 refers to the result of the measurement with the structure taking into account these arrangements.

Second Embodiment

A second embodiment will be described below, in which parts of the electronic control unit common to the first embodiment may be not described in detail.

In the present embodiment, the second shield portion is arranged to not only the first side surface 46a but also the second side surface 46b among the multiple side surfaces 46.

Figure 6:
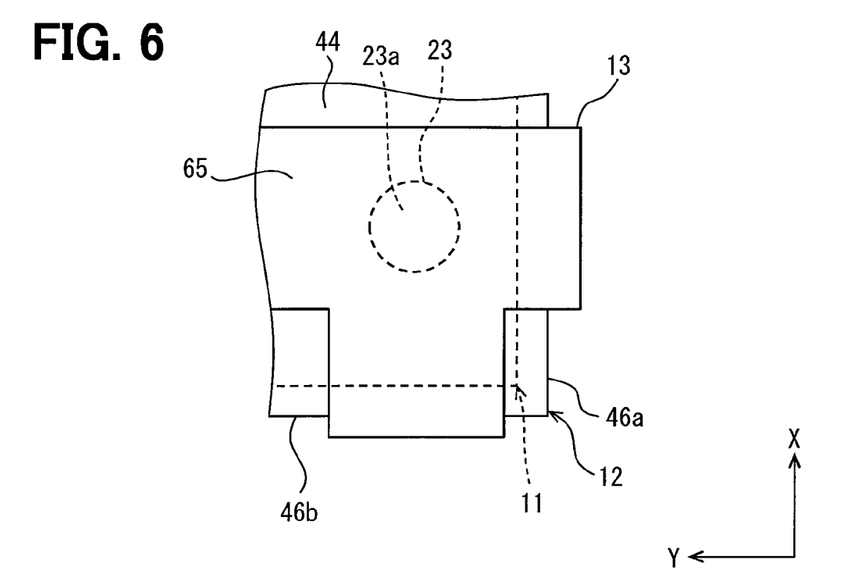
FIG. 6 is a top view illustrating a structure around a first shield portion of an electronic control unit of a second embodiment.
Figure 7:
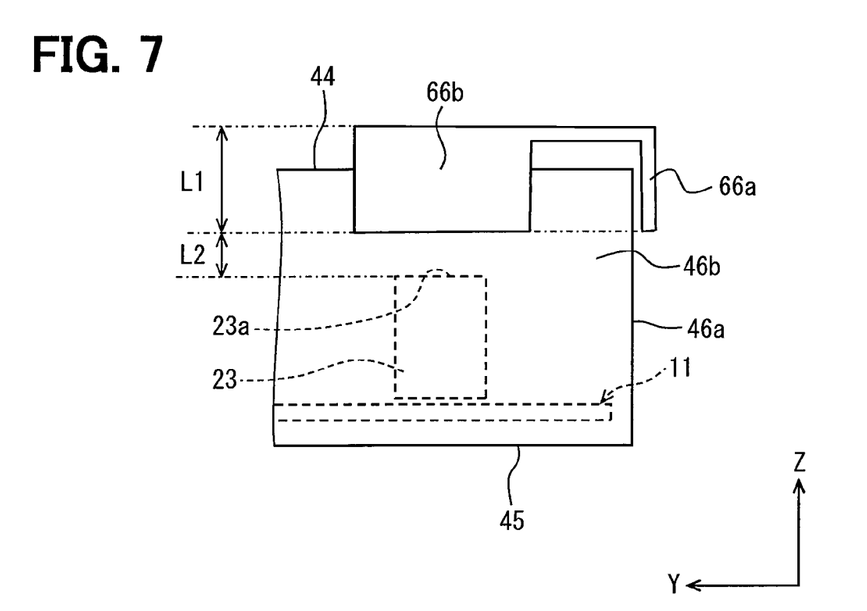
FIG. 7 is a side view illustrating a structure around a second shield portion of the electronic control unit of the second embodiment.

As shown in FIGS. 6 and 7, the metal bracket 13 includes second shield portions 66a, 66b. The second shield portion 66a has the same structure as the second shield portion 66 of the first embodiment. Specifically, the second shield portion 66a is arranged to the first side surface 46a, which is closest to the coil 23 among the side surfaces 46. Additionally, the second shield portion 66a is arranged to extend in the z-direction so that when projected in the y-direction perpendicular to the first side surface 46a, the second shield portion 66a and the upper end surface 23a of the coil 23 have a gap therebetween. Additionally, the second shield portion 66a is arranged so that in the x-direction parallel to the first side surface 46a and perpendicular to the z-direction, the position of the second shield portion 66a and the position of the coil 23 matches with each other at least in part.

The second shield portion 66b is bent with respect to the first shield portion 65 and extends in the z-direction, like the second shield portion 66a. The second shield portion 66b is arranged to the second side surface 46b, which is the second-closest to the coil 23 among the side surfaces 46. The arrangement of the second shield portion 66b relative to the second side surface 46b and the coil 23 is the same as the arrangement of the second shield portion 66a (the second shield portion 66) relative to the first side surface 46a and the coil 23

Specifically, the second shield portion 66b is supported in a floating state relative to the second side surface 46b. Additionally, as shown in FIG. 7, the second shield portion 66b is arranged to extend in the z-direction so that when projected in the x-direction perpendicular to the second side surface 46b, the second shield portion 66b and the upper end surface 23a of the coil 23 have a gap therebetween. Specifically, the length L2 of the gap is substantially equal to or less than the length L1 of the second shield portion 66b. Furthermore, the second shield portion 66b is arranged so that in the y-direction parallel to the second side surface 46b and perpendicular to the z-direction, the position of the second shield portion 66b and the position of the coil 23 matches with each other at least in part.

In the above-mentioned structure, because the second shield portion 66*b* arranged to the second side surface 46*b* is added, the radiation noise can be reduced as compared with the structure in which the second shield portion 66 is arranged to only the first side surface 46*a*.

In employing this structure, it may be preferable that the coil 23 be positioned near any one of four corners of the circuit board 11, which has the rectangular shape as its planer shape. Accordingly, the two side surfaces 46*a*, 46*b* are close to the coil 23 and the two second shield portions 66*a*, 66*b* can efficiently reduce the radiation noise.

Although the first and second embodiments have been illustrated, embodiments are not limited to the respective embodiments illustrated above. The above embodiments can be extended and/or modified in various ways, examples of which will be described.

The above embodiments illustrate the engine ECU as an example of the electronic control unit 10. However, the electronic control unit 10 is not limited to the engine ECU. The electronic control unit 10 may be any in-vehicle electronic control unit as long as the in-vehicle electronic control unit includes a coil 23 and a power supply circuit 22 which performs voltage conversion.

Arrangements of the first shield portion 65 and the second shield portion 66 are not limited to those illustrated in the above embodiments. It may suffice that the first shield portion 65 is arranged to only a part of the upper surface 44 of the case 12 such that when projected in the z-direction which matches with the winding axis direction of the coil 23, the first shield portion 65 overlaps at least a part of the coil 23. It may suffice that the second shield portion 66 extends from the first shield portion 65 in the z-direction and is arranged to only a part of the side surface 46.

In the above embodiments, the first shield portion 65 is arranged so that when projected in the z-direction, i.e., the winding axis direction of the coil 23, the first shield portion 65 overlaps the whole of the coil 23. Alternatively, the first shield portion 65 may be arranged to overlap only a part of the coil 23. When the first shield portion 65 is arranged to overlap at least a part of the coil 23, the first shield portion 65 is close to the coil 23, and thus, the reduction of the radiation noise by the reflection loss and the attenuation loss can be enhanced. In this regard, it may be preferable that the first shield portion 65 overlap the whole of the coil 23.

Figure 8:
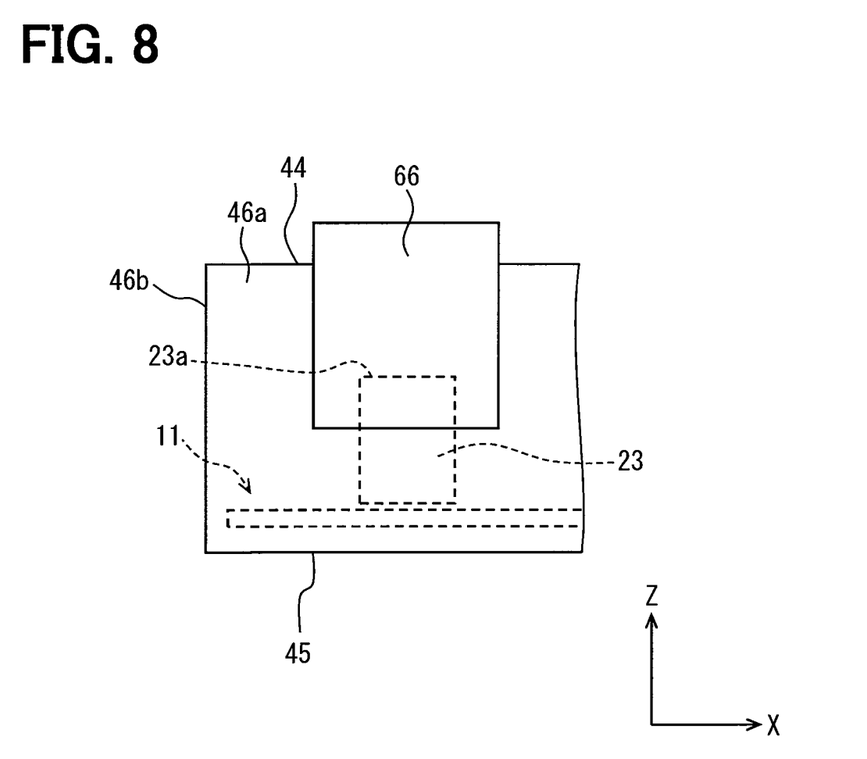
FIG. 8 is a side view illustrating a structure around a second shield portion of an electronic control unit of a first modification.

In the first embodiment, the second shield portion 66 is arranged to extend in the z-direction so that when projected in the y-direction perpendicular to the corresponding first side surface 46*a*, the second shield portion 66 and the upper end surface 23*a* of the coil 23 have a gap therebetween. Alternatively, in a first modification illustrated in FIG. 8, the second shield portion 66 may be arranged to extend in the z-direction so that when projected in the y-direction perpendicular to the corresponding first side surface 46*a*, the second shield portion 66 overlaps at least a part of the coil 23. In this regard, when the length of the second shield portion 66 is decreased to form a gap between the second shield portion 66 and the upper end surface 23*a* of the coil 23, it is also possible to efficiently reduce the radiation noise. Therefore, if the technical effect is sufficiently ensured even when the length of the second shield portion 66 is decreased to form a gap between the second shield portion 66 and the upper end surface 23*a* of the coil 23, the weight reduction of the electronic control unit 10 can be achieved by making the length of the second shield portion 66 shorter. These are applicable to the structure of the second embodiment.

In the first embodiment, the x-direction is perpendicular to the z-direction and parallel to the first side surface 46*a* to which the second shield portion 66 is arranged. The second shield portion 66 is arranged so that in the x-direction, the position of the second shield portion 66 and the coil 23 match with each other at least in part. Alternatively, the second shield portion 66 may be arranged so that in the x-direction, the position of the second shield portion 66 and the coil 23 do not match with each other. In other words, the second shield portion 66 may be arranged so that in the x-direction, the second shield portion 66 and the coil 23 are spaced apart from each other. This is applicable to the structure of the second embodiment.

In the above embodiments, the case 12 has the rectangular shape as its planar shape. In the first embodiment, the second shield portion 66 is arranged to the first side surface 46*a*, which is closest to the coil 23 among the four side surfaces 46 of the case 12. In the second embodiment, the second shield portions 66*a* and 66*b*, respectively, are arranged to the first side surface 46*a* closest to the coil 23 and the second side surface 46*b* next closest to the coil 23 among the four side surfaces 46. However, the arrangement of the second shield portion 66 is not limited to the above examples. It may be suffice that the second shield portion 66 be arranged to only a part of the side surfaces 46. For example, the second shield portion 66 may be arranged to only the side surface 46 that is the third-closest side surface. In this regard, as the second shield portion 66 is closer to the coil 23, the reflection loss and the attenuation loss are larger.

The planer shape of the case 12 is not limited to a rectangular shape. The planer shape of the case 12 may be a polygonal shape. In this case also, the same technical effects can be achieved as in the case of the rectangular shape. The planer shape of the case 12 may be other than the polygonal shape. For example, the planer shape of the case 12 may be a circular shape.

In the above embodiments, a material of the metal bracket 13 is not specifically described. In this regard, as along as the metal bracket 13 is made of metal, the above technical effects can be achieved. For example, when the metal bracket 13 is made of a non-magnetic material such as Cu etc., the above technical effects can be achieved. However, when the metal bracket 13 is made of a magnetic material such as Fe etc., the reduction of the radiation noise can be enhanced. Specifically, when the metal bracket 13 (shield portion 65, 66) made of a magnetic material is used, the metal bracket 13 further functions as a magnetic shield. More specifically, lines of magnetic force are guided into each shield portion 65, 66 for bypassing. This can further reduce the radiation noise. Moreover, a magnetic material has high magnetic permeability. Because the attenuation loss is proportional to the square root of the magnetic permeability, the radiation noise can be further reduced.

In the above embodiments, the metal bracket 13 is fixed to the case 12 by press-fitting. However, a fixing manner is not limited to this example. For example, the metal bracket 13 is fixed to the case 12 by screwing.

In the above embodiments, the pre-formed (pre-prepared) case 12 is illustrated as a resin member covering the circuit board 11. In this case, the resin member may be molded together with the circuit board 11. For example, a mold resin body may be molded with the metal bracket 13 being an insert part. The metal bracket 13 may fixed to the mold resin body by press-fitting.

What is claimed is:

1. An in-vehicle electronic control unit comprising:
 a circuit board having a front surface and a rear surface opposite to the front surface and equipped with a power supply circuit that performs voltage conversion, wherein a coil constituting the power supply circuit is mounted on the front surface of the circuit board;

a resin member covering the circuit board to protect the circuit board, wherein an outer surface of the resin member has an upper surface and a lower surface opposite to the upper surface, wherein the upper surface of the resin member is located on a front surface side of the circuit board and the lower surface of the resin member is located on a rear surface side of the circuit board, wherein the outer surface of the resin member further has a side surface that connects the upper surface and the lower surface; and a metal bracket for attaching the circuit board to a vehicle, wherein the metal bracket is fixed to the resin member, wherein the metal bracket includes:

a first shield portion arranged to only a part of the upper surface of the resin member so that when projected in a winding axis direction of the coil, the first shield portion overlaps at least a part of the coil; and a second shield portion extending from the first shield portion in the winding axis direction of the coil and arranged to only a part of the side surface of the resin member, wherein the metal bracket is to be electrically connected to a body of the vehicle.

2. The in-vehicle electronic control unit according to claim 1, wherein when projected in the winding axis direction of the coil, the first shield portion overlaps a whole of the coil.

3. The in-vehicle electronic control unit according to claim 1, wherein:

the coil has an upper end surface on an opposite side from the front surface of the circuit board; and the second shield portion is arranged to extend in the winding axis direction of the coil so that when projected in a direction perpendicular to the winding axis direction of the coil, the second shield portion and the upper end surface of the coil have a gap therebetween.

4. The in-vehicle electronic control unit according to claim 1, wherein:

the resin member is polygonal in a plane perpendicular to the winding axis direction of the coil;

the side surface to which the second shield portion is arranged is one of a plurality of side surfaces of the resin member; and in a direction perpendicular to the winding axis direction of the coil and parallel to the one of the plurality of side surfaces of the resin member, a position of the second shield portion and a position of the coil match with each other at least in part.

5. The in-vehicle electronic control unit according to claim 1, wherein:

the resin member is polygonal in a plane perpendicular to the winding axis direction of the coil; and the side surface to which the second shield portion is arranged is one of a plurality of side surfaces of the resin member and is closest to the coil among the plurality of side surfaces.

6. The in-vehicle electronic control unit according to claim 1, wherein the metal bracket is made of a magnetic material.

* * * * *